United States Patent [19]
Ward

[11] 4,185,324
[45] Jan. 22, 1980

[54] DATA STORAGE SYSTEM

[75] Inventor: William P. Ward, Poway, Calif.

[73] Assignee: NCR Corporation, Dayton, Ohio

[21] Appl. No.: 930,613

[22] Filed: Aug. 3, 1978

[51] Int. Cl.² .................. G11C 19/28; G11C 7/06
[52] U.S. Cl. .......................... 365/222; 307/221 C; 365/75; 365/183
[58] Field of Search ............... 365/222, 183, 73, 75; 307/221 C, 221 D

[56] References Cited

U.S. PATENT DOCUMENTS

| | | | |
|---|---|---|---|
| 3,946,368 | 3/1976 | Cheu | 365/222 |
| 3,999,171 | 12/1976 | Parson | 365/73 |
| 4,085,459 | 4/1978 | Hiratayashi | 365/222 |

FOREIGN PATENT DOCUMENTS 2509567  9/1976  Fed. Rep. of Germany ........... 365/222

*Primary Examiner*—Stuart N. Hecker
*Attorney, Agent, or Firm*—J. T. Cavender; Edward Dugas; Stephen F. Jewett

[57] ABSTRACT

A data storage system having a charge coupled device (CCD) shift register and a detection circuit for detecting the binary value represented by the charge level or signal within each cell location of the CCD shift register. The detection circuit includes a sense amplifier for comparing the signals from two adjacent cell locations, with one signal representing a known binary value. The comparison of adjacent cell locations compensates for signal losses during shifting, since the losses experienced by adjacent cell locations are nearly identical. Switching transistors cause an adjustment voltage to be added to one of the signals prior to comparison. The output of the sense amplifier is provided to a flip-flop, which in turn has an output initially set at the known binary value and which controls the switching transistors.

10 Claims, 3 Drawing Figures

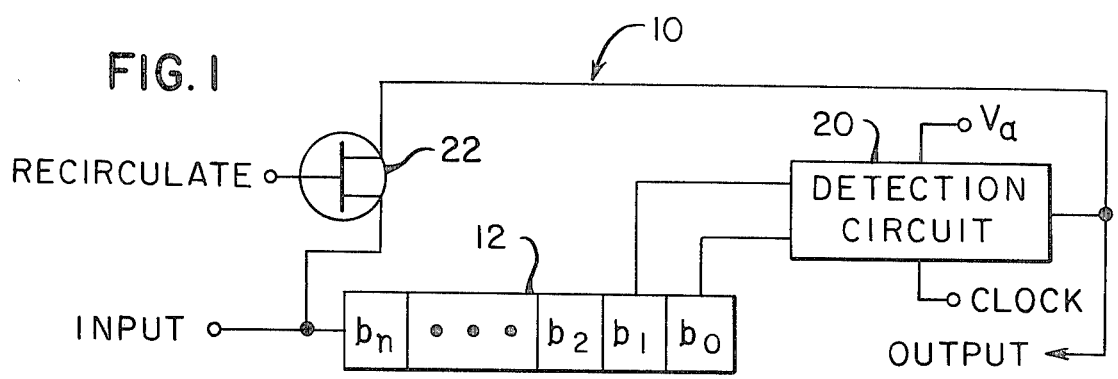
FIG. 1
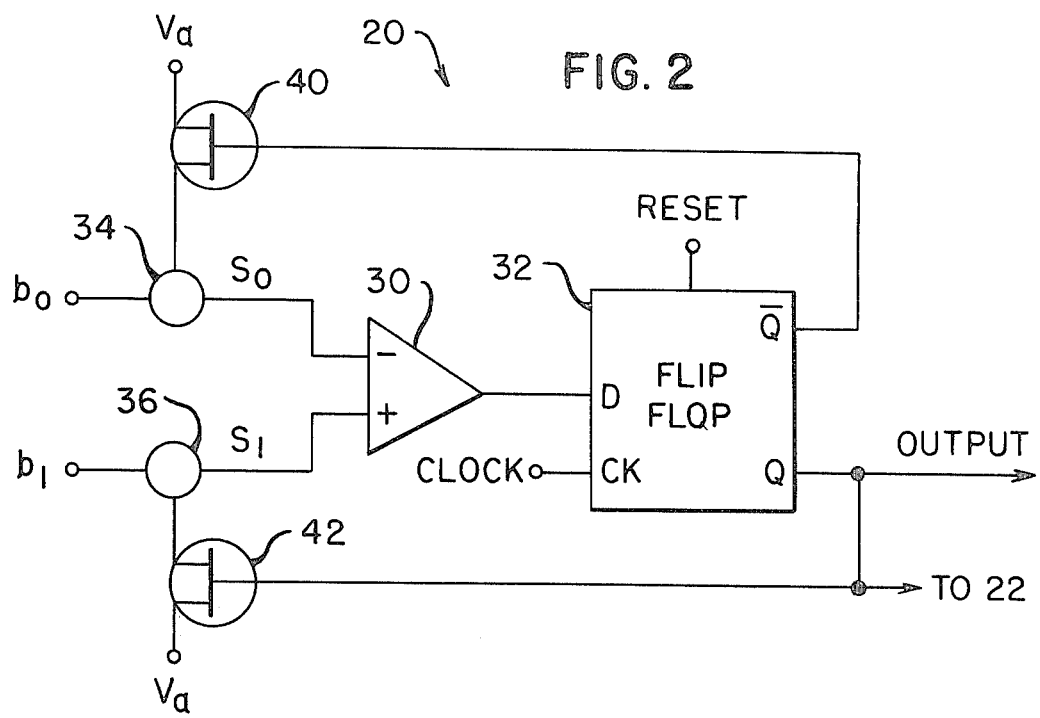
FIG. 2
FIG. 3
| $b_0$ | $b_1$ | $S_0$ | $S_1$ | OUTPUT OF AMP 30 | OUTPUT (Q) OF F/F 32 | |
|---|---|---|---|---|---|---|
| | | | | | BEFORE CLOCK | AFTER CLOCK |
| 0 | 0 | $V_a$ | 0 | 0 | 0 | 0 |
| 0 | 1 | $V_a$ | 1 | 1 | 0 | 1 |
| 1 | 0 | 1 | $V_a$ | 0 | 1 | 0 |
| 1 | 1 | 1 | $1+V_a$ | 1 | 1 | 1 |

DATA STORAGE SYSTEM

BACKGROUND OF THE INVENTION

The present invention relates to a data storage system, and more particularly, to the detection of data in a system having a shift register storage device.

Semiconductor charge-transfer devices, such as charge-coupled devices (CCD's), are well-known and have been used and proposed for use in various applications relating to the storage of data.

One problem associated with CCD's is the difficulty in reliably and accurately detecting the data stored in the device. A CCD operates much like a serial shift register, with the bits of information represented by charge packets serially shifted through the CCD. During the shifting, the CCD frequently experiences charge losses. The losses are affected by various considerations, and can vary from one device to another. For example, CCD's are sensitive to variations in temperature, clocking frequency and the physical dimensions within the device.

In the past, detection of the data in a CCD has been accomplished by comparing the signal from each cell with an external reference signal. However, if significant cell-to-cell losses occur, such a comparison does not reliably detect the stored data. To minimize cell-to-cell losses it is necessary that there be frequent regeneration of the data and that operating temperatures be kept within specified ranges, among other things. These constraints have increased the cost and physical size of CCD's and thus made them undesirable for many memory applications.

SUMMARY OF THE INVENTION

In the present invention, a memory or data storage system having a shift register, such as a charge coupled device shift register, is provided with a detection circuit which detects the data value of the charge level or signal within a given cell by comparing that charge level with the charge level in an adjacent cell having a known data value. Since adjacent cells will normally experience nearly identical losses as they are shifted through the charge-coupled device, the detection circuit in the present invention can provide a highly reliable and accurate means of determining the value of the data represented by the charge level even when high or uncertain cell-to-cell charge or signal losses are present.

Since high cell-to-cell losses will not prevent reliable detection of data in a memory system in accordance with the present invention, the CCD in the memory system can have a large number of cells in comparison with prior art CCD's, and thus hold and shift a large amount of data before needing regeneration. Furthermore, fewer manufacturing and operating constraints are necessary to minimize cell-to-cell losses, and the CCD within the system can thereby be manufactured and operated at a lower cost.

It is therefore an object of the present invention to provide an improved data storage system.

Another object of the present invention is to provide an improved CCD shift register device which has data that can be reliably read despite cell-to-cell signal losses.

A further object of the present invention is to provide a CCD that can be manufactured and operated at a lower cost.

Still a further object of the present invention is to provide a detection circuit for reliably detecting the data stored in a shift register, such as a CCD shift register.

BRIEF DESCRIPTION OF THE DRAWINGS

FIG. 1 illustrates a data storage system, including a shift register and detection circuit, in accordance with the present invention.

FIG. 2 is a circuit diagram illustrating the detection circuit of FIG. 1.

FIG. 3 is a table illustrating the operation of the detection circuit shown in FIG. 2.

DESCRIPTION OF THE PREFERRED EMBODIMENT

Referring now to FIG. 1, a data storage system 10 is illustrated. The data storage system 10 includes a charge transfer device, such as a charge coupled device (CCD) shift register 12. A CCD, as is well-known, stores packets of charges in potential wells, or packets, and moves or transfers the charge packets along a series of storage or cell locations, from one cell to the next, in order to function as a serial shift register. The shifting is accomplished in a well known manner by proper sequential application of clock pulses (not shown). The individual cells within the shift register 12 are labeled $b_0$ through $b_n$. The illustrated storage system 10 stores binary data and each of the cells $b_0$ through $b_n$ stores a bit of data having either a logic level "0" or a logic level "1".

The two most rightward cell locations as viewed in FIG. 1, $b_0$ and $b_1$, are connected to the two data inputs of a detection circuit 20. The output of the detection circuit 20 provides, in a manner which will be discussed in greater detail later, the logic level of the data bit within the cell location $b_1$. The cell location $b_0$ is initially loaded with a reference or marker bit, and thus the shift register 12 can store a total of n-1 data bits plus a single marker bit. The marker bit is necessary because data value detection is accomplished in the system 10 by sensing the difference between the voltages or signals within the two adjacent cell locations $b_0$ and $b_1$, with the value within cell location $b_0$ always known. The marker bit value can initially be written into cell location $b_0$, and can have a binary value of either logic level "0" or logic level "1".

The output of the detection circuit is provided to the input of the shift register 12 by way of a field-effect transistor (FET) 22. When data is being recirculated in the shift register, an enabling voltage is applied to the illustrated "RECIRCULATE" terminal. The FET 22 becomes conductive and the data bit at the $b_0$ cell is regenerated by circuit 20 to its full value and passed through the FET 22 to the $b_n$ cell.

The detection circuit 20, in addition to receiving the data inputs from the cell locations $b_0$ and $b_1$, also receives a clocking signal, designated CLOCK, and an adjustment voltage, designated $V_a$. The detection circuit 20 is illustrated in greater detail in FIG. 2.

In FIG. 2, the detection circuit 20 is seen to include a sense amplifier 30 and a flip-flop 32. The amplifier 30 has a first, positive (+) input terminal and a second, negative (−) input terminal. The negative input terminal of the amplifier 30 is connected to the $b_0$ cell by a summing node 34 and the positive input terminal of the amplifier 30 is connected to the $b_1$ cell by a summing node 36. The signals from the summing nodes 34 and 36 are designated $S_0$ and $S_1$, respectively. The amplifier 30 can be a differential amplifier of conventional design that compares the signals $S_0$ and $S_1$, and at its output provides a full voltage "0" logic level signal if $S_0$ is larger, and a full voltage "1" logic level signal if $S_1$ is larger.

The summing nodes 34 and 36 are connected to the adjustment voltage $V_a$ by field-effect transistors (FET's) 40 and 42, respectively. The gate of the FET 40 is connected to the inverted output $\overline{Q}$ of the flip-flop 32 and the gate of the FET 42 is connected to the non-inverted output $Q$ of flip-flop 32. The reason for the connection of FET's 40 and 42 in this manner will become apparent later when the operation of detection circuit 20 is described. Briefly, however, the summing by nodes 34 and 36 of the voltage $V_a$ to either one of the signals from $b_0$ and $b_1$ is especially important when $b_0$ and $b_1$ store the same binary value. By the connection of the FET's 40 and 42 to the outputs of the flip-flop 32, the positive terminal of amplifier 30 senses a larger voltage when both $b_0$ and $b_1$ are at a "1" logic level, and the negative terminal of amplifier 30 senses a larger voltage when both $b_0$ and $b_1$ are at a "0" logic level.

Although the signal losses experienced by $b_0$ and $b_1$ are nearly identical, there will normally be a very small loss from cell-to-cell and $V_a$ must have a value at least slightly greater than the worst case cell-to-cell loss that could be present from $b_1$ to $b_0$. For a typical CCD, a value of one-half the difference between the full voltage levels of the "0" and "1" binary logic levels would be satisfactory. It should be noted, however, that $V_a$ should not exceed the difference in the full voltage values or levels of the "0" and "1" logic levels. Otherwise, an erroneous comparison could be made by amplifier 30.

The flip-flop 32 also receives a "RESET" signal which resets the flip-flop to the value of the marker bit when the marker bit is in the $b_0$ cell. The RESET signal could be generated by a source external to the detection circuit 20, such as a memory controller, or the detection circuit could include an internal counter circuit (not shown) responsive to each cell-to-cell shift within the shift register 12 so that each time the marker bit reaches the $b_0$ cell the output of the counter circuit resets the flip-flop 32. While the register 12 is mentioned as only having one marker bit, it should be appreciated that more than one marker bit could be located at spaced apart cells along the register, and that the flip-flop 32 could be reset each time one of the marker bits reaches the $b_0$ cell.

The operation of the detection circuit 20 will now be described with reference to FIGS. 2 and 3. The detection circuit is initialized when the marker bit is in the $b_0$ cell. If the marker bit has been given, for example, a binary value of "0", the flip-flop 32 is reset so that a "0" logic level signal appears at the output Q of flip-flop 32.

At the initialization of the detection circuit 20, the signal at the $b_0$ cell and at the input to the summing node 34 will be a "0" logic level and the signal from the $b_1$ cell and at the input to the summing node 36 will be at an unknown binary value, which value is desired at the output of the detection circuit 20. When the output Q of the flip-flop 32 is at a "0" logic level, the output $\overline{Q}$ is at a "1" logic level, and the FET 40 is made conductive and connects the voltage $V_a$ to the summing node 34. The output of summing node 34, $S_0$, then has a value of $V_a$ and is supplied to the negative input terminal of the amplifier 30. The FET 42, on the other hand, is not conductive, and therefore the positive terminal of the amplifier 30 receives the output of summing node 36, $S_1$, having the same value as the value of the signal from the cell $b_1$.

If the signal from $b_1$ represents a "0" logic level, the signal $S_1$ will be at "0", the voltage at the negative terminal of amplifier 30 ($V_a$) will be greater, and therefore the output of amplifier 30 will be "0", restored to its full voltage level. When the flip-flop 32 receives the CLOCK signal, the "0" logic level at its input D will be clocked into the flip-flop and appears at the output Q. On the other hand, if the signal from the $b_1$ cell represents a "1" logic level, the signal at the positive terminal of the amplifier 30 will be greater, and a "1" is provided at the output of the amplifier 30 and is clocked into the flip-flop 32. It can thus be seen that the output of the detection circuit 20 provides, with the necessary amplification to full voltage levels, the logic of the signal from the $b_1$ cell.

When data is shifted one cell location to the right as viewed in FIG. 1, such shifting generally occurring at the same time that the flip-flop 32 receives the CLOCK signal, the data represented by the signal within the cell $b_1$ is now in the cell $b_0$. If $b_1$ was formerly at a "1" logic level, then a "1" is now in $b_0$ and at the output Q of flip-flop 32, and the FET 42 is now conductive. The positive input terminal of amplifier 30 receives the signal $S_1$ representing whatever logic level is now in $b_1$, plus the adjustment voltage $V_a$. The negative terminal of the amplifier 30 receives the signal $S_0$ having the same value as the signal from $b_0$. If $b_1$ is now at a "1" logic level, the $S_1$ signal at the positive input terminal of amplifier 30 will be a "1" plus $V_a$, and a "1" appears at the output of amplifier 30 and is clocked into the flip-flop 32. On the other hand, if $b_1$ is at a "0" logic level, the $S_1$ signal at the positive input terminal of amplifier 30 will be at $V_a$ and, with the $S_0$ signal at the negative input terminal of amplifier 30 at a "1", a "0" appears at the output of amplifier 30 and is clocked into the flip-flop 32.

The table in FIG. 3 illustrates, for each of the values of $b_0$ and $b_1$, the resulting signals $S_0$ and $S_1$, the output of amplifier 30, and the logic level of the signal appearing at the output Q of the flip-flop 32 both before and after the CLOCK signal. It can be noted from FIG. 3 that the output of the flip-flop before the CLOCK is at the same value as $b_0$, and after the CLOCK is at the value of $b_1$.

It can thus be seen that the value of the signal in the $b_1$ cell is determined by comparing the signals from the $b_0$ and $b_1$ cells, with the value of $b_0$ being known, either because it has the value of a marker bit and the flip-flop 32 has been reset to such value, or it has the value of the bit just shifted from the $b_1$ cell, and the value of such bit has been clocked into the flip-flop. In either case, the determination of what logic level is represented by the signal from the $b_1$ cell is made by comparison with the signal from $b_0$ cell, rather than with a reference voltage, as is done in the prior art. A reliable determination is made even if large or unknown signal losses are experienced during shifting, as long as the signals representing the two binary values are not both completely lost.

Although the presently preferred embodiment of the invention has been described, it will be understood that within the purview of this invention various changes may be made within the scope of the appended claims.

What is claimed is:

1. A memory system, comprising:

register means having a plurality of storage locations, each storage location for storing data represented by a signal of a predetermined level; and detection circuit means for detecting the data stored in one of said storage locations, including adjustment means for receiving the signal in said one storage location and the signal representing known data in a storage location adjacent said one storage location and adding an adjustment signal to one of the signals in said one and said adjacent storage locations, and comparison means for receiving from said adjustment means the signals from said one and said adjacent storage locations, including the adjusted one of the signals, and comparing the signals to determine the difference between the value of the data in said one and said adjacent storage locations.

2. The system of claim 1, wherein said register means comprises a CCD serial shift register.

3. In a memory system having a charge transfer device shift register with a plurality of storage cells, with each storage cell for holding a charge level representing data:

a detection circuit for detecting the value of the charge level in one of said storage cells, including comparison means for comparing the charge level in said one storage cell with the charge level in an adjacent storage cell having a known charge level value and adjustment means for adding an adjustment signal to the value of one of the charge levels in said one storage cell and said adjacent storage cell to compensate for cell-to-cell signal loss prior to comparing of the charge levels by said comparison means.

4. The memory system of claim 3, wherein said charge transfer device shift register comprises a CCD shift register.

5. The memory system of claim 3, wherein said charge transfer device shift register includes a storage cell having a reference charge level.

6. The memory system of claim 5, wherein said charge transfer device shift register stores binary data having two binary values, wherein said detection circuit includes flip-flop means for receiving from said comparison means the binary value of data represented by the charge level in said one storage cell, and wherein said flip-flop means includes means for resetting said flip-flop means to the binary value of said reference charge level when said reference charge level is located in said adjacent storage cell.

7. The memory system of claim 6, wherein said adjustment means adds an adjustment signal having a value greater than the value of the worst case cell-to-cell loss in said shift register and less than the difference in value between the full values of the two binary data values.

8. In a data storage system having a charge coupled device shift register with a plurality of storage cells for storing signals representing binary data of either a logic "1" or a logic "0" value, a detection circuit for detecting the binary data, comprising:

a sense amplifier for receiving at a first input terminal the signal from one storage cell and for receiving at a second input terminal the signal from a storage cell adjacent said one storage cell, for comparing the signals and producing a logic "1" signal if the signal at said first input terminal is greater, and a logic "0" signal if the signal at said second input terminal is greater;

flip-flop means for receiving and storing the signal produced by said sense amplifier, including reset means for causing the flip-flop means to store a reference binary value signal when data having a reference binary value is stored in said adjacent storage cell; and means for summing an adjustment signal to one of the signals from said one and said adjacent storage cells prior to being received by the input terminals of said sense amplifier, said summing means controlled by said flip-flop means so that when both signals from said one and said adjacent storage cells represent logic "0", the signal at said second input terminal is greater, and when both signals from said one and said adjacent storage cells represent a logic "1", the signal at said first input terminal is greater, said adjustment signal having a value greater than the worst case cell-to-cell loss in said shift register and less than the difference between the full values of the two binary data values.

9. In a memory system having a shift register with a plurality of storage cells, with each storage cell storing data represented by a signal of a predetermined level, a detection circuit for detecting data stored in one of said storage cells, comprising:

comparison means for receiving the signal from said one storage cell and the signal from an adjacent storage cell representing known data, and indicating which of the signals is greater; and means for selectively summing an adjustment signal to either one of the signals received by said comparison means from said one and said adjacent storage cells, said adjustment signal being greater than the worst case cell-to-cell signal loss between said one and said adjacent storage cells so that when the signal in said one and said adjacent storage cells have signals representing the same data value, the signal having the adjustment signal summed thereto will be greater.

10. A method for detecting the data value of the signal in one storage cell of a charge-coupled device serial shift register, comprising:

providing a known data value to the signal in a storage cell adjacent said one storage cell;

adding an adjustment signal to one of the signals from said one storage cell and from said adjacent storage cell, said adjustment signal having a value greater than the worst case cell-to-cell loss in said shift register; and comparing the signals from said one and said adjacent storage cells, including the adjusted one of the signals.

* * * * *